United States Patent
Kubota et al.

(10) Patent No.: US 6,628,681 B2
(45) Date of Patent: Sep. 30, 2003

(54) LASER APPARATUS

(75) Inventors: Shigeo Kubota, Kanagawa (JP); Michio Oka, Tokyo (JP)

(73) Assignee: Sony Corporation, Tokyo (JP)

( * ) Notice: Subject to any disclaimer, the term of this patent is extended or adjusted under 35 U.S.C. 154(b) by 6 days.

(21) Appl. No.: 10/098,148

(22) Filed: Mar. 15, 2002

(65) Prior Publication Data

US 2002/0136246 A1 Sep. 26, 2002

(30) Foreign Application Priority Data

Mar. 16, 2001 (JP) ......................... 2001-077041

(51) Int. Cl.[7] .................................................. H01S 3/10
(52) U.S. Cl. ............................... 372/25; 372/6; 372/22; 372/32
(58) Field of Search .............................. 372/25, 32, 6, 372/22

(56) References Cited

U.S. PATENT DOCUMENTS 5,694,408 A * 12/1997 Bott et al. .................. 372/6
5,790,721 A * 8/1998 Lee ........................... 385/11

* cited by examiner

*Primary Examiner*—Leon Scott, Jr.
(74) *Attorney, Agent, or Firm*—Oblon, Spivak, McClelland, Maier & Neustadt, P.C.

(57) ABSTRACT

A laser apparatus includes a master laser for emitting reference laser pulse light RPref having a wavelength of 914 nm and a pulse width of 0.5 ns; a microlens array for dividing the reference laser pulse light RPref into N pieces of light; optical fiber amplifiers 14-1 to 14-N being set to increase their length progressively in that order so as to have a propagation delay time of 0.5 ns, which is the pulse width of the divided pieces of reference laser pulse light DRPref1 to DRPrefN; a third harmonic generating unit for receiving the divided pieces of reference laser pulse light on which amplifying and delaying effects have been produced, and generating third harmonics TRD1 to TRDN having a wavelength of 305 nm and a pulse width of 0.5 ns; and an illuminating optical system for successively disposing the N third harmonics TRD1 to TRDN in parallel with each other, subjecting the N third harmonics TRD1 to TRDN to time multiplexing, and emitting the result.

14 Claims, 12 Drawing Sheets

F I G. 3
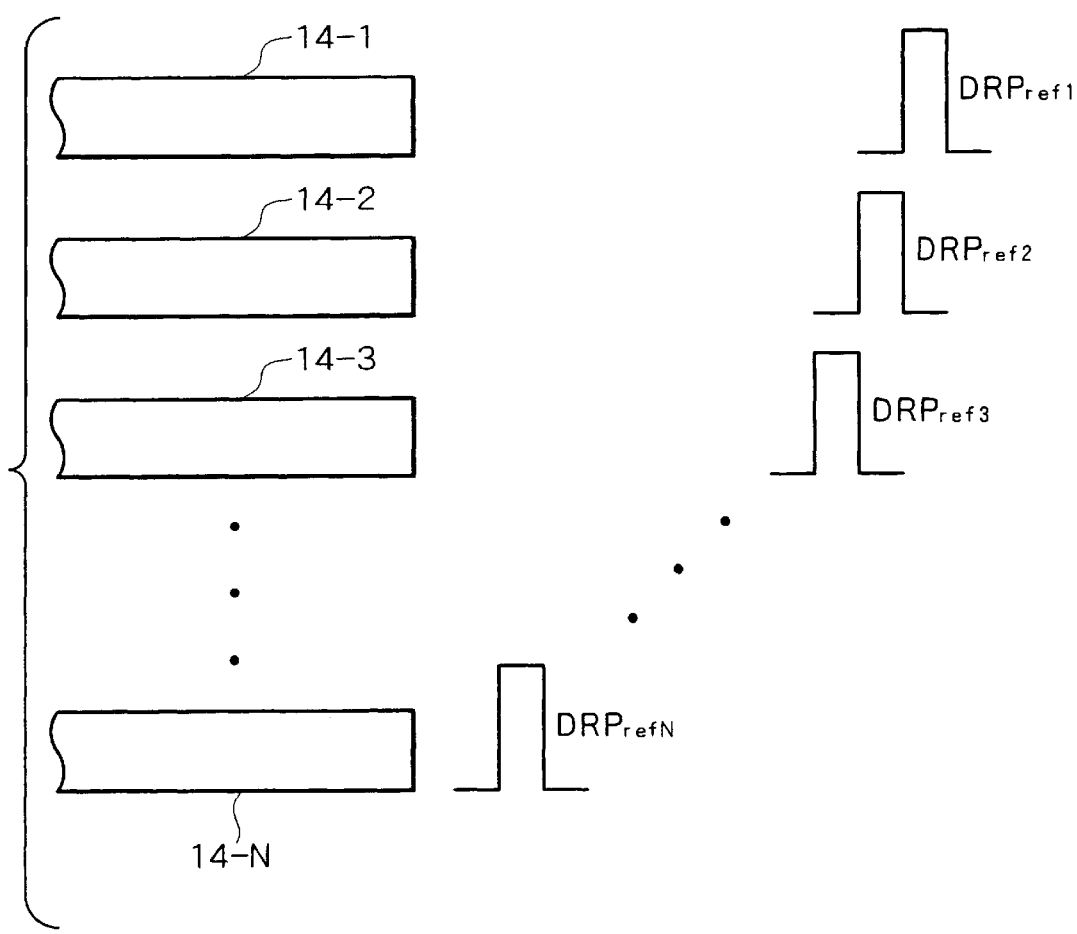

Blue (457 [nm]): 2 [W]
(457 [nm]) → 305 [nm]
CONVERSION EFFICIENCY: 60 [%]

AVERAGE POWER: 1.2 [W]
REPETITION FREQUENCY: 1 [MHz]
PULSE WIDTH: 0.5 [nsec]
BEAM SIZE: $5 \times 10^{-4}$ [cm$^2$]
PEAK POWER DENSITY: $4.8 \times 10^6$ [W/cm$^2$]

77.5μm

LASER APPARATUS

BACKGROUND OF THE INVENTION

The present invention relates to a laser apparatus, and particularly to a laser apparatus suitable for annealing treatment performed for improvement of characteristics during the manufacturing of TFTs (Thin Film Transistors) used as an active device for controlling current and a switching device of each pixel in an active matrix display employing liquid crystal or an organic electroluminescence (EL) device, for example.

Generally, an active matrix display has a large number of pixels arranged in a matrix manner, and displays an image by controlling light intensity of each of the pixels according to given brightness information.

When liquid crystal is used as electro-optical material, transmissivity of each pixel is changed according to voltage written to the pixel.

An active matrix display using an organic EL device as electro-optical material basically operates in the same manner as when liquid crystal is used as electro-optical material.

In a liquid crystal display (LCD), for example, a TFT is used as a switching device of each pixel to apply voltage to a liquid crystal layer on a display electrode. The TFT controls alignment of the liquid crystal and thereby controls transmission of backlight from the back side of a glass substrate.

Liquid crystal displays and the like use quartz glass having resistance to a high heat temperature of 1000° C. as the glass substrate. Since the quartz substrate is expensive, however, inexpensive glass having resistance to a low heat temperature of 600° C. has recently been used.

Thus, process temperatures in TFT fabrication are controlled below the heat temperature that the substrate can resist. Polycrystalline silicon (polysilicon) has a carrier mobility higher than that of amorphous silicon (a-Si) film by about two orders of magnitude, and therefore is suitable for use in a large display having a high operating speed and having a large number of pixels.

When polysilicon is to be formed on a glass substrate, a method is used which anneals a-Si film by laser light to recrystallize the a-Si film into polysilicon film, to avoid thermal deformation and the like of the glass substrate.

Conventionally, a XeCl excimer laser having an oscillation wavelength of 308 nanometers (nm) is used in a laser annealing apparatus for carrying out the annealing treatment.

According to known materials of Lambda Physik, the fluence required to anneal a TFT using the XeCl excimer laser having the oscillation wavelength of 308 nm is a few hundred $mJ/cm^2$; the average output power is 200 W; the repetition frequency is 300 Hz; and the pulse width is about 20 nanoseconds (ns).

This makes it possible to obtain optical energy sufficient to melt an a-Si film surface. Incidentally, the silicon surface is melted by annealing to 1420° C. or higher.

Although the excimer laser can achieve a high output in a short-wavelength range, however, the excimer laser has disadvantages of having a large apparatus size and lacking in stability of output pulses.

As a result, the annealing apparatus becomes large and lacks in stability of annealing processing. Thus, there has been a desire for development of a laser apparatus having a smaller size and producing stable output pulses.

SUMMARY OF THE INVENTION

It is accordingly an object of the present invention to provide a laser apparatus that can be miniaturized and can stabilize output pulses, and accordingly makes it possible to miniaturize and stabilize annealing apparatus and the like.

In order to achieve the above object, according to a first aspect of the present invention, there is provided a laser apparatus including: a laser light source for emitting reference laser pulse light having a predetermined wavelength and a predetermined pulse width; a plurality of optical fibers having different propagation delay characteristics for propagating light; light dividing means for dividing the reference laser pulse light emitted from the laser light source into a plurality of pieces of light to propagate each of the divided pieces of reference laser pulse light through one of the plurality of optical fibers; and light combining means for successively disposing the divided pieces of reference laser pulse light propagated through the plurality of optical fibers and emitted from the plurality of optical fibers in parallel with each other and emitting laser pulse light having a pulse width greater than the pulse width of the reference laser pulse light.

Also, in the laser apparatus according to the first aspect of the present invention, the light combining means includes: wavelength changing means for changing wavelength of the divided pieces of reference laser pulse light emitted from the plurality of optical fibers to a wavelength shorter than the predetermined wavelength; and an optical system for successively disposing the plurality of pieces of laser pulse light changed in wavelength by the wavelength changing means in parallel with each other and emitting laser pulse light having a pulse width greater than the pulse width of the reference laser pulse light.

In addition, in the laser apparatus according to the first aspect of the present invention, the wavelength changing means includes at least one nonlinear optical crystal for generating an n-order harmonic (n is an integer of two or more) on the basis of incident light.

Preferably, the wavelength changing means includes: a first nonlinear optical crystal for receiving the divided pieces of reference laser pulse light emitted from the plurality of optical fibers, generating a plurality of second harmonics, and emitting the plurality of divided pieces of reference laser pulse light and the plurality of second harmonics; and a second nonlinear optical crystal for generating third harmonics on the basis of the plurality of divided pieces of reference laser pulse light and the plurality of second harmonics emitted from the first nonlinear optical crystal; and the optical system successively disposes the plurality of third harmonics emitted from the second nonlinear optical crystal in parallel with each other and emits laser pulse light having a pulse width greater than the pulse width of the reference laser pulse light.

Moreover, in the laser apparatus according to the first aspect of the present invention, the plurality of optical fibers are each set at a different propagation length so that the pieces of laser pulse light are sequentially emitted with a propagation delay time corresponding to the pulse width of the reference laser pulse light.

According to a second aspect of the present invention, there is provided a laser apparatus including: a laser light source for emitting reference laser pulse light having a predetermined wavelength and a predetermined pulse width; a plurality of optical fiber amplifiers having different propagation delay characteristics for propagating light for amplifying the propagating light with a gain corresponding to intensity of excitation light supplied thereto; excitation light supplying means for supplying the excitation light to the plurality of optical fiber amplifiers; light dividing means for dividing the reference laser pulse light emitted from the laser light source into a plurality of pieces of light to propagate each of the divided pieces of reference laser pulse light through one of the plurality of optical fiber amplifiers; and light combining means for successively disposing the divided pieces of reference laser pulse light propagated through the plurality of optical fiber amplifiers and emitted from the plurality of optical fiber amplifiers in parallel with each other and emitting laser pulse light having a pulse width greater than the pulse width of the reference laser pulse light.

Also, in the laser apparatus according to the second aspect of the present invention, the light combining means includes: wavelength changing means for changing wavelength of the divided pieces of reference laser pulse light emitted from the plurality of optical fiber amplifiers to a wavelength shorter than the predetermined wavelength; and an optical system for successively disposing the plurality of pieces of laser pulse light changed in wavelength by the wavelength changing means in parallel with each other and emitting laser pulse light having a pulse width greater than the pulse width of the reference laser pulse light.

In addition, in the laser apparatus according to the second aspect of the present invention, the wavelength changing means includes at least one nonlinear optical crystal for generating an n-order harmonic (n is an integer of two or more) on the basis of incident light.

Preferably, the wavelength changing means includes: a first nonlinear optical crystal for receiving the divided pieces of reference laser pulse light emitted from the plurality of optical fiber amplifiers, generating a plurality of second harmonics, and emitting the plurality of divided pieces of reference laser pulse light and the plurality of second harmonics; and a second nonlinear optical crystal for generating third harmonics on the basis of the plurality of divided pieces of reference laser pulse light and the plurality of second harmonics emitted from the first nonlinear optical crystal; and the optical system successively disposes the plurality of third harmonics emitted from the second nonlinear optical crystal in parallel with each other and emits laser pulse light having a pulse width greater than the pulse width of the reference laser pulse light.

Moreover, in the laser apparatus according to the second aspect of the present invention, the plurality of optical fiber amplifiers are each set at a different propagation length so that the pieces of laser pulse light are sequentially emitted with a propagation delay time corresponding to the pulse width of the reference laser pulse light.

Furthermore, in the laser apparatus according to the second aspect of the present invention, intensity of the excitation light supplied to the plurality of optical fiber amplifiers is set at a desired value for each of the plurality of optical fiber amplifiers.

According to the present invention, the laser light source emits reference laser pulse light having a predetermined wavelength, for example a near-infrared wavelength of 914 nm and a pulse width of 0.5 ns to the light dividing means.

The light dividing means divides the reference laser pulse light entered therein into a plurality of pieces of light to propagate the divided pieces of reference laser pulse light through the plurality of optical fiber amplifiers, for example.

Each of the optical fiber amplifiers is supplied with the excitation light by the excitation light supplying means, for example. Each of the divided pieces of reference laser pulse light being propagated through the optical fiber amplifiers is amplified with an induction gain corresponding to intensity of the excitation light to compensate for a reduction in optical power caused by dividing the reference laser pulse light, and then the divided pieces of reference laser pulse light are emitted from the other end surfaces of the optical fiber amplifiers to the light combining means.

The plurality of optical fiber amplifiers are provided with propagation delay characteristics different from each other for the divided pieces of reference laser pulse light, or the propagating light.

For example, the plurality of optical fiber amplifiers are each set at a length such that the pieces of laser pulse light are sequentially emitted with a propagation delay time corresponding to the pulse width of the reference laser pulse light.

Thus, the plurality of divided pieces of reference laser pulse light are emitted from the plurality of optical fiber amplifiers to the light combining means with a timing relation representing a shift of 0.5 ns, for example.

In the light combining means, the first nonlinear optical crystal, for example, changes the wavelength, which is 914 nm, of each of the plurality of divided pieces of reference laser pulse light incident thereon on the basis of nonlinear polarization to thereby generate second harmonics having a wavelength of 457 nm.

The plurality of second harmonics generated by the first nonlinear optical crystal and the plurality of divided pieces of reference laser pulse light are entered into the second nonlinear optical crystal.

The second nonlinear optical crystal then performs sum frequency mixing of the plurality of divided pieces of reference laser pulse light having the wavelength of 914 nm and the plurality of second harmonics having the wavelength of 457 nm entered therein, thereby generates a plurality of third harmonics having a wavelength of 305 nm, and then emits the plurality of third harmonics to the optical system.

Then, the optical system successively disposes the plurality of third harmonics in parallel with each other and emits laser pulse light having a pulse width greater than the pulse width of the reference laser pulse light.

BRIEF DESCRIPTION OF THE DRAWINGS

FIG. 3 is a diagram showing a timing relation between pieces of pulse light emitted from a plurality of optical fiber amplifiers having different propagation delay characteristics according to the present invention;

DESCRIPTION OF THE PREFERRED EMBODIMENTS

Figure 1:
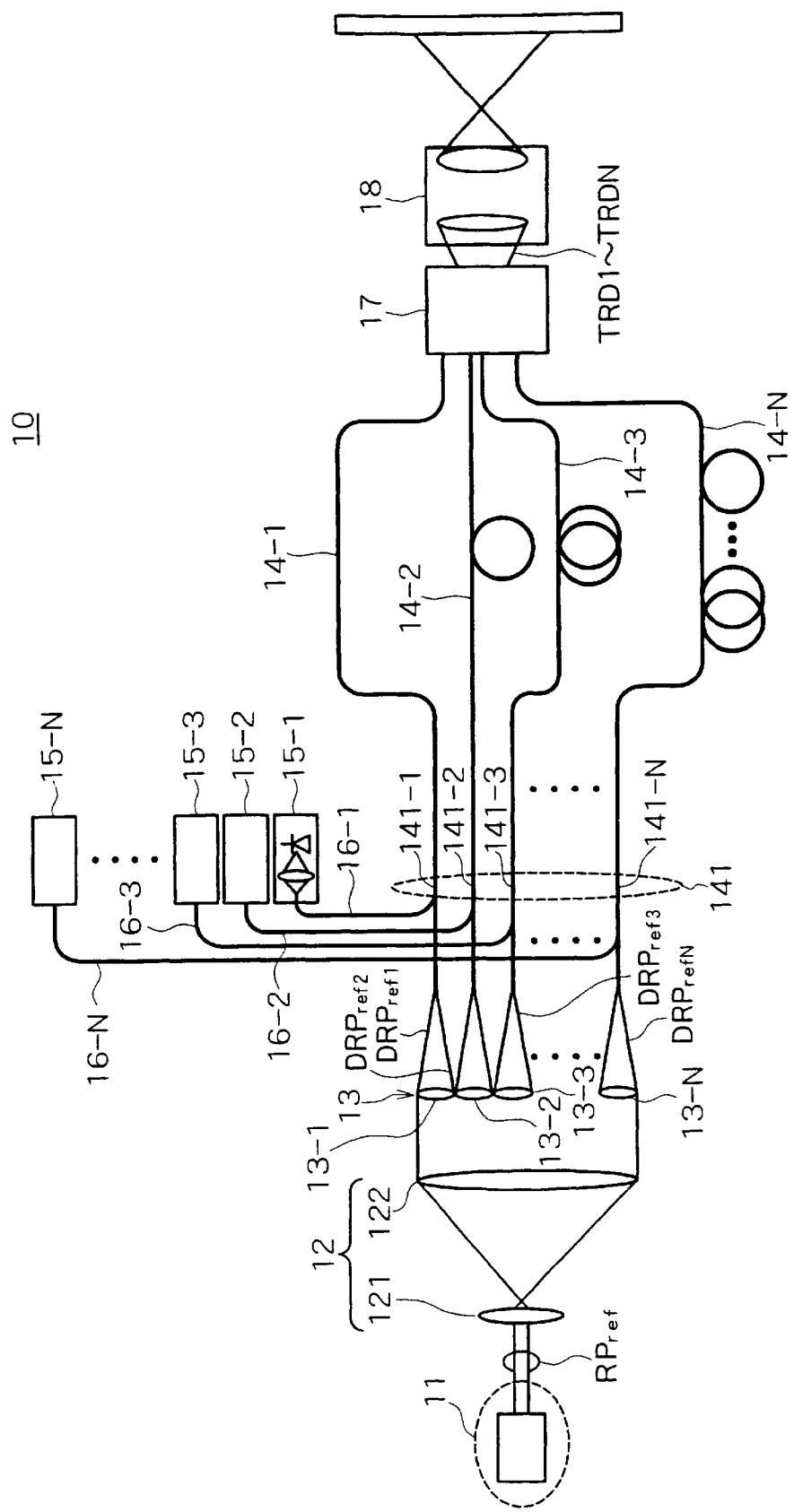
FIG. 1 is a configuration diagram showing an embodiment of a laser apparatus according to the present invention.

FIG. 1 is a configuration diagram showing an embodiment of a laser apparatus according to the present invention.

The laser apparatus 10 has a master laser 11 as a laser light source, a beam expander 12, a microlens array 13, a plurality of N optical fiber amplifiers 14-1 to 14-N having different propagation delay characteristics for propagating light, fiber coupled type excitation laser light sources 15-1 to 15-N, excitation light propagating optical fibers 16-1 to 16-N, a third harmonic generating unit 17 as wavelength changing means, and an illuminating optical system 18.

The beam expander 12 and the microlens array 13 form light dividing means. The third harmonic generating unit 17 and the illuminating optical system 18 form light combining means. The excitation laser light sources 15-1 to 15-N, the excitation light propagating optical fibers 16-1 to 16-N, and optical fiber couplers 141-1 to 141-N, which will be described later, form excitation light supplying means.

The master laser 11 is formed by a near-infrared microchip laser having an oscillation wavelength of 914 nm, for example. The master laser 11 emits reference laser pulse light RPref having a wavelength of 914 nm and a pulse width of 0.5 ns to the beam expander 12.

A pulse repetition frequency of the master laser 11 is 1 MHz or more, for example, and is sufficiently higher than a pulse repetition frequency of a XeCl excimer laser of 300 Hz.

Figure 2:
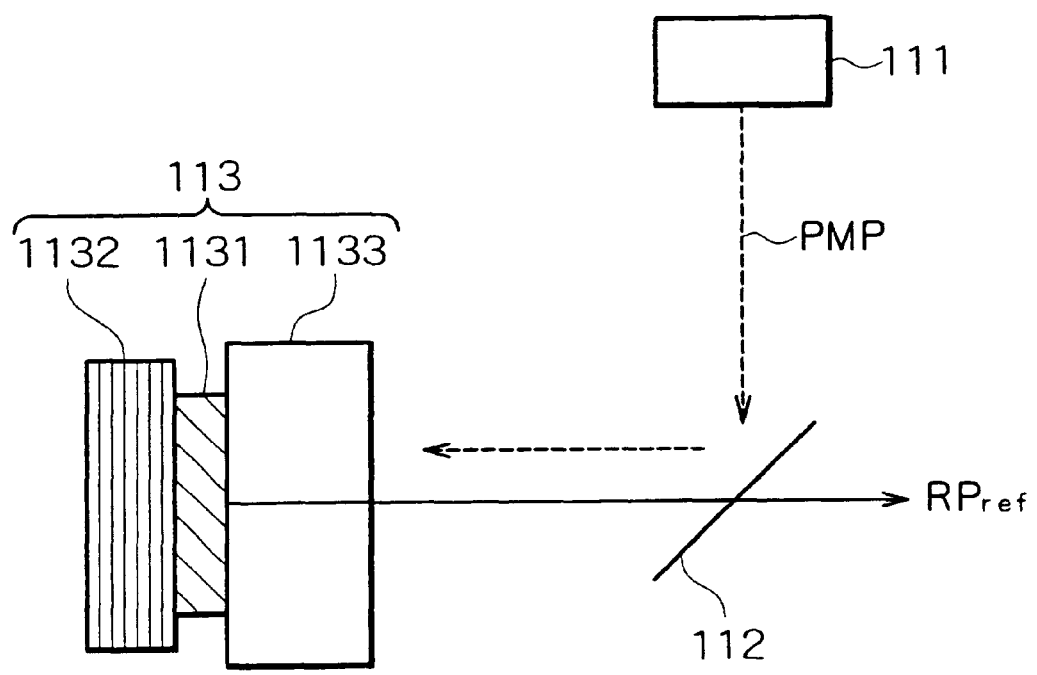
FIG. 2 is a diagram showing an example of configuration of a master laser as a laser light source according to the present invention.

FIG. 2 is a diagram showing an example of configuration of the master laser 11.

As shown in FIG. 2, the master laser 11 has: an excitation light source 111 for emitting excitation light PMP with an output power of 100 mW and a wavelength of 808 nm, for example; a dichroic mirror 112 for reflecting the excitation light PMP having the wavelength of 808 nm and transmitting the reference laser pulse light RPref having the wavelength of 914 nm; and a resonator unit 113 for emitting the reference laser pulse light RPref having the wavelength of 914 nm and the pulse width of 0.5 ns to the dichroic mirror 112 by being brought into an excited state in response to the excitation light PMP reflected by the dichroic mirror 112.

The resonator unit 113 is formed by a laser rod 1131 including Nd:YVO$_4$, for example, and a semiconductor supersaturation absorber mirror 1132 and an output mirror 1133 each formed at an end surface portion of the laser rod 1131.

The beam expander 12 is formed by two lenses 121 and 122 having a coinciding focal length. The beam expander 12 converts the reference laser pulse light RPref in the form of a thin collimated light beam emitted from the master laser 11 into a thick collimated light beam, and then enters the thick collimated light beam into the microlens array 13.

The microlens array 13 has N microlenses 13-1 to 13-N disposed in a line in an entrance area of the reference laser pulse light RPref converted into the thick collimated light beam by the beam expander 12. The microlenses 13-1 to 13-N split (hereinafter referred to as "divide") the reference laser pulse light RPref into N pieces of light (images), and focus the divided pieces of reference laser pulse light DRPref1 to DRPrefN on one end surface of the corresponding optical fiber amplifiers 14-1 to 14-N, respectively, to thereby propagate the divided pieces of reference laser pulse light DRPref1 to DRPrefN through the optical fiber amplifiers 14-1 to 14-N, respectively.

Specifically, as shown in FIG. 1, the microlens 13-1 focuses the divided reference laser pulse light DRPref1 on one end surface of the optical fiber amplifier 14-1. Similarly, the microlens 13-2 focuses the divided reference laser pulse light DRPref2 on one end surface of the optical fiber amplifier 14-2. The microlens 13-3 focuses the divided reference laser pulse light DRPref3 on one end surface of the optical fiber amplifier 14-3. The microlens 13-N focuses the divided reference laser pulse light DRPrefN on one end surface of the optical fiber amplifier 14-N.

The optical fiber amplifiers 14-1 to 14-N are each formed by a doubly clad type optical fiber to which a rare-earth element of neodymium (Nd), for example, is added.

One end portion of the excitation light propagating optical fibers 16-1 to 16-N each formed by a multimode optical fiber is fused and thus optically coupled to one end surface side of the optical fiber amplifiers 14-1 to 14-N to form an optical fiber coupler portion 141.

Specifically, one end portion of the optical fiber 16-1 is fused and coupled to one end surface side of the optical fiber amplifier 14-1 to form an optical fiber coupler 141-1. The optical fiber amplifier 14-1 is brought into an excited state by excitation light having a wavelength of 808 nm which excitation light is propagated via the optical fiber coupler 141-1, amplifies the divided reference laser pulse light DRPref1 entering the optical fiber amplifier 14-1 from one end surface thereof with an induction gain corresponding to intensity of the excitation light to compensate for a reduction in optical power caused by dividing the reference laser pulse light DRPref1, and then emits the divided reference laser pulse light DRPref1 from the other end surface of the optical fiber amplifier 14-1 to the third harmonic generating unit 17.

Similarly, one end portion of the optical fiber 16-2 is fused and coupled to one end surface side of the optical fiber amplifier 14-2 to form an optical fiber coupler 141-2. The optical fiber amplifier 14-2 is brought into an excited state by excitation light having a wavelength of 808 nm which excitation light is propagated via the optical fiber coupler 141-2, amplifies the divided reference laser pulse light DRPref2 entering the optical fiber amplifier 14-2 from one end surface thereof with a gain corresponding to intensity of the excitation light to compensate for a reduction in optical power caused by dividing the reference laser pulse light RPref, further amplifies the divided reference laser pulse light DRPref2 with a gain by a maximum of 30 to 40 dB, and then emits the divided reference laser pulse light DRPref2 from the other end surface of the optical fiber amplifier 14-2 to the third harmonic generating unit 17.

One end portion of the optical fiber 16-3 is fused and coupled to one end surface side of the optical fiber amplifier 14-3 to form an optical fiber coupler 141-3. The optical fiber amplifier 14-3 is brought into an excited state by excitation light having a wavelength of 808 nm which excitation light is propagated via the optical fiber coupler 141-3, amplifies the divided reference laser pulse light DRPref3 entering the optical fiber amplifier 14-3 from one end surface thereof with a gain corresponding to intensity of the excitation light to compensate for a reduction in optical power caused by dividing the reference laser pulse light RPref, further amplifies the divided reference laser pulse light DRPref3 by a maximum of 30 to 40 dB, and then emits the divided reference laser pulse light DRPref3 from the other end surface of the optical fiber amplifier 14-3 to the third harmonic generating unit 17.

One end portion of the optical fiber 16-N is fused and coupled to one end surface side of the optical fiber amplifier 14-N to form an optical fiber coupler 141-N. The optical fiber amplifier 14-N is brought into an excited state by excitation light having a wavelength of 808 nm which excitation light is propagated via the optical fiber coupler 141-N, amplifies the divided reference laser pulse light DRPrefN entering the optical fiber amplifier 14-N from one end surface thereof with a gain corresponding to intensity of the excitation light to compensate for a reduction in optical power caused by dividing the reference laser pulse light RPref, further amplifies the divided reference laser pulse light DRPrefN by a maximum of 30 to 40 dB, and then emits the divided reference laser pulse light DRPrefN from the other end surface of the optical fiber amplifier 14-N to the third harmonic generating unit 17.

The N optical fiber amplifiers 14-1 to 14-N with such an amplifying function have propagation delay characteristics different from each other for the propagating light, that is, the divided reference laser pulse light.

In the present embodiment, the different propagation delay characteristics are given as follows.

In the present embodiment, propagation delay is provided by rendering lengths of the N optical fibers different from each other.

Thus, delay time is determined by the fiber length, and therefore very accurate delay time can be achieved.

Incidentally, letting an index of refraction of a fiber be n=1.5 and a fiber length difference be ΔL, propagation delay time Tdly is given by the following equation:
[Equation 1]

$$\text{Propagation delay time } T_{dly} = n\Delta L/c = t = 0.5 \text{ns} \quad (1)$$

From the equation (1), $\Delta L = ct/n = 10$ cm, where $c = 3 \times 10^8$ m/s is the velocity of light.

Specifically, when it is assumed that length of the optical fiber amplifier 14-1 is L1, length L2 of the optical fiber amplifier 14-2 is set at (L1+10 cm); length L3 of the optical fiber amplifier 14-3 is set at (L2+10 cm=L1+20 cm); and length LN of the optical fiber amplifier 14-N is set at (LN-1+10 cm=L1+(N−1)×10 cm).

It is relatively easy to achieve such a fiber length difference of 10 cm in manufacturing.

The divided pieces of reference laser pulse light DRPref1 to DRPrefN having a pulse width of 0.5 ns are emitted from the optical fiber amplifiers 14-1 to 14-N provided with the propagation delay as described above with a timing relation representing a shift of 0.5 ns as shown in FIG. 3.

Figure 4:
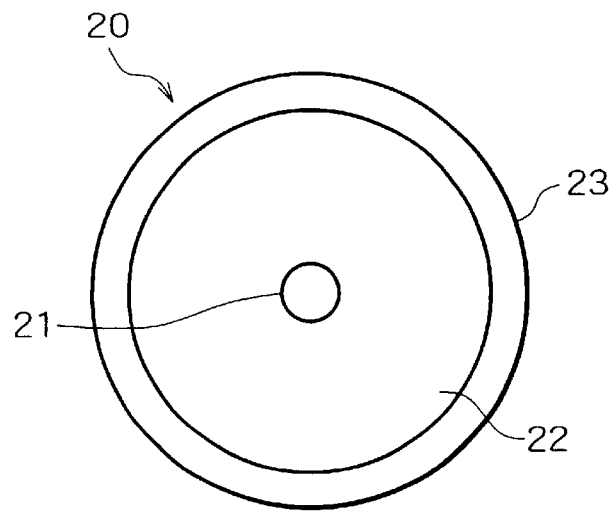
FIG. 4 is a diagram of assistance in explaining structure of a doubly clad type optical fiber.

The doubly clad type optical fiber 20 has a structure as shown in FIG. 4, for example.

Specifically, as shown in FIG. 4, the doubly clad type optical fiber 20 is formed by a core 21 having an index of refraction n1, a first cladding 22 having an index of refraction n2 formed so as to cover the core 21, and a second cladding 23 formed so as to cover the first cladding 22.

The index of refraction n1 of the core 21, the index of refraction n2 of the first cladding 22, and the index of refraction n3 of the second cladding 23 satisfy the following relation:

$$n1 > n2 > n3 \quad \text{[Equation 2]}$$

Figure 5:
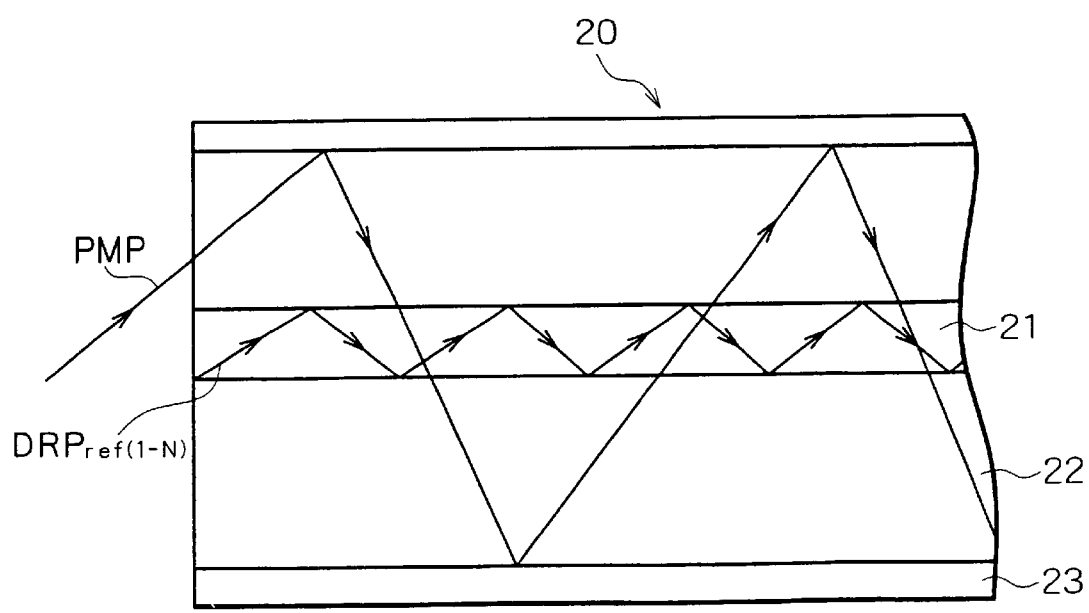
FIG. 5 is a diagram of assistance in explaining propagating optical paths of excitation light and divided reference laser pulse light in the doubly clad type optical fiber.

As shown in FIG. 5, in the doubly clad type optical fiber amplifiers 14-1 to 14-N having such a structure, the excitation light PMP entering via the optical fiber couplers 141-1 to 141-N is propagated through the first cladding 22, while the divided pieces of reference laser pulse light DRPref1 to DRPrefN are propagated through the core 21.

The fiber coupled type excitation laser light source 15-1 focuses the excitation light having a wavelength of 808 nm on the other end surface of the optical fiber 16-1 at a predetermined output power, for example 8 W, to propagate the excitation light.

Similarly, the fiber coupled type excitation laser light source 15-2 focuses the excitation light having a wavelength of 808 nm on the other end surface of the optical fiber 16-2 at a predetermined output power, for example 8 W, to propagate the excitation light.

The fiber coupled type excitation laser light source 15-3 focuses the excitation light having a wavelength of 808 nm on the other end surface of the optical fiber 16-3 at a predetermined output power, for example 8 W, to propagate the excitation light.

The fiber coupled type excitation laser light source 15-N focuses the excitation light having a wavelength of 808 nm on the other end surface of the optical fiber 16-N at a predetermined output power, for example 8 W, to propagate the excitation light.

The third harmonic generating unit 17 receives the divided pieces of reference laser pulse light DRPref1 to DRPrefN having a wavelength of 914 nm emitted from the other end surfaces of the N optical fiber amplifiers 14-1 to 14-N, generates third harmonics TRD1 to TRDN having a wavelength of 305 nm and a pulse width of 0.5 ns, and then emits the third harmonics TRD1 to TRDN to the illuminating optical system.

The illuminating optical system 18 emits pulse light obtained by successively disposing N pieces of laser pulse light of the third harmonics TRD1 to TRDN obtained by wavelength conversion by the third harmonic generating unit 17 in parallel with each other and then subjecting the N pieces of laser pulse light to so-called time multiplexing, the obtained pulse light having a pulse width (for example 10 nsec) N or more times the pulse width of 0.5 ns of the reference laser pulse light RPref.

A concrete example of configuration of the third harmonic generating unit 17 and the illuminating optical system 18 will be described in the following with reference to FIG. 6.

Figure 6:
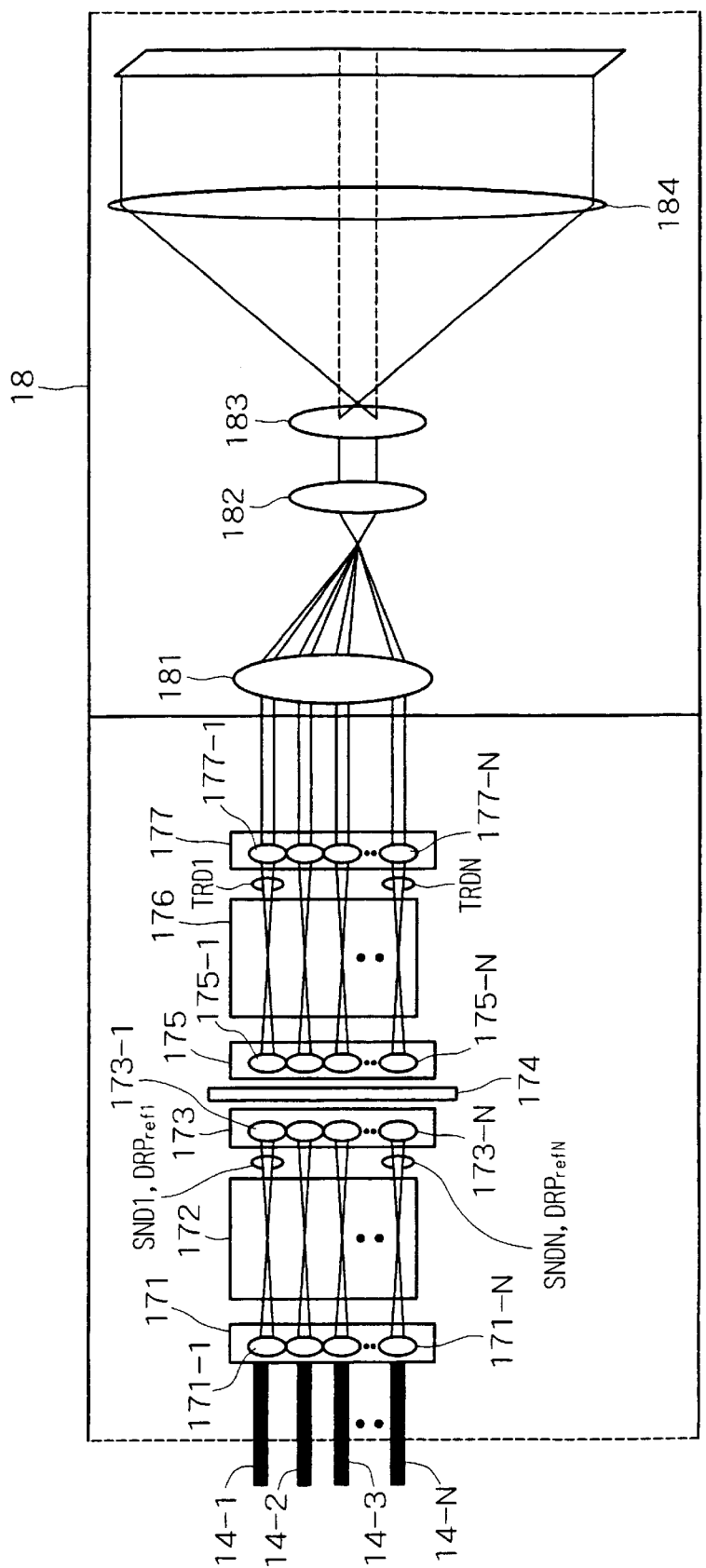
FIG. 6 is a diagram showing a concrete example of configuration of a third harmonic generating unit and an illuminating optical system according to the present embodiment.

FIG. 6 is a diagram showing a concrete example of configuration of the third harmonic generating unit and the illuminating optical system according to the present invention.

The configuration of the third harmonic generating unit 17 will first be described.

As shown in FIG. 6, the third harmonic generating unit 17 has a first microlens array 171, a first nonlinear optical crystal 172, a second microlens array 173, a half-wave plate 174, a third microlens array 175, a second nonlinear optical crystal 176, and a fourth microlens array 177.

The first microlens array 171 has N microlenses 171-1 to 171-N disposed in a line so as to correspond to the end surfaces (other end surfaces) of the optical fiber amplifiers 14-1 to 14-N for emitting the divided pieces of reference laser pulse light DRPref1 to DRPrefN. The microlenses 171-1 to 171-N condense the divided pieces of reference laser pulse light DRPref1 to DRPrefN, and enter the resulting pieces of reference laser pulse light DRPref1 to DRPrefN into the first nonlinear optical crystal 172.

Incidentally, though not shown in the figure, the end surface (other end surface) sides of the optical fiber amplifiers 14-1 to 14-N for emitting the divided pieces of reference laser pulse light DRPref1 to DRPrefN are fixed in a V-groove array having N V-grooves, for example.

The first nonlinear optical crystal 172 is formed by LBO ($LiB_3O_5$), for example. The first nonlinear optical crystal 172 converts the wavelength (or optical frequency), which wavelength is 914 nm, of each of the divided pieces of reference laser pulse light DRPref1 to DRPrefN entered via the first microlens array 171 on the basis of nonlinear polarization, thereby generating second harmonics having a wavelength of 457 nm, and emits the generated second harmonics SND1 to SNDN and the divided pieces of reference laser pulse light DRPref1 to DRPrefN to the second microlens array 173.

The second microlens array 173 has N microlenses 173-1 to 173-N disposed in a line so as to correspond to the end surface (other end surface) portions of the first nonlinear optical crystal 172 for emitting the divided pieces of reference laser pulse light DRPref1 to DRPrefN and the second harmonics SND1 to SNDN. The microlenses 173-1 to 173-N convert the divided pieces of reference laser pulse light DRPref1 to DRPrefN and the second harmonics SND1 to SNDN into collimated light beams, and then enter the collimated light beams into the half-wave plate 174.

Of the divided pieces of reference laser pulse light DRPref1 to DRPrefN and the second harmonics SND1 to SNDN entered via the second microlens array 173, the half-wave plate 174 preserves planes of polarization of the divided pieces of reference laser pulse light DRPref1 to DRPrefN as they are, rotates planes of polarization of the second harmonics SND1 to SNDN by 90°, and then enters the divided pieces of reference laser pulse light DRPref1 to DRPrefN and the second harmonics SND1 to SNDN into the third microlens array 175.

The third microlens array 175 has N microlenses 175-1 to 175-N disposed in a line so as to correspond to the end surface (other end surface) portions of the half-wave plate 174 for emitting the divided pieces of reference laser pulse light DRPref1 to DRPrefN and the second harmonics SND1 to SNDN whose planes of polarization are rotated by 90°. The microlenses 175-1 to 175-N condense the divided pieces of reference laser pulse light DRPref1 to DRPrefN and the second harmonics SND1 to SNDN, and enter the divided pieces of reference laser pulse light DRPref1 to DRPrefN and the second harmonics SND1 to SNDN into the second nonlinear optical crystal 176.

The second nonlinear optical crystal 176 is formed by LBO ($LiB_3O_5$), for example. The second nonlinear optical crystal 176 performs sum frequency mixing of the divided pieces of reference laser pulse light DRPref1 to DRPrefN having the wavelength of 914 nm and the second harmonics SND1 to SNDN having the wavelength of 457 nm entered via the third microlens array 175, thereby generating third harmonics having a wavelength of 305 nm, and emits the generated third harmonics TRD1 to TRDN (and the divided pieces of reference laser pulse light DRPref1 to DRPrefN) to the fourth microlens array 177.

The fourth microlens array 177 has N microlenses 177-1 to 177-N disposed in a line so as to correspond to the end surface (other end surface) portions of the second nonlinear optical crystal 176 for emitting the third harmonics TRD1 to TRDN (and the divided pieces of reference laser pulse light DRPref1 to DRPrefN). The microlenses 177-1 to 177-N convert the third harmonics TRD1 to TRDN into collimated light beams, and then emit the collimated light beams to the illuminating optical system 18 in the next stage.

Incidentally, it is desirable in practice that an optical filter for removing the components of the wavelength of 914 nm be disposed on the entrance side or the emitting side of the fourth microlens array 177.

Figures 7, 8:
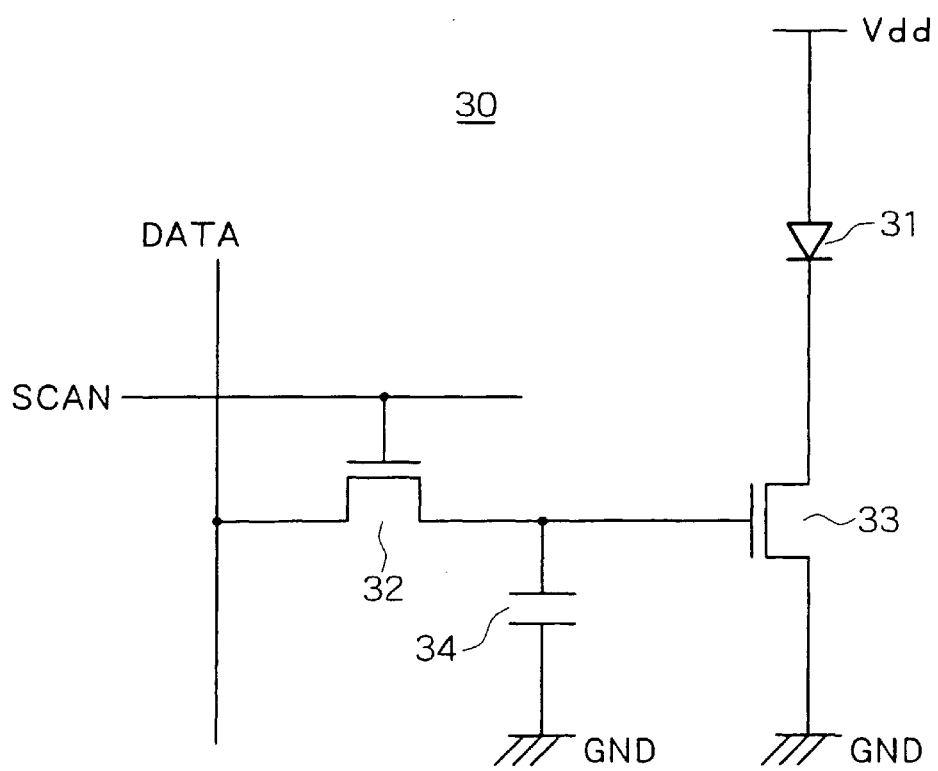
FIG. 7 is a diagram of assistance in explaining characteristics of third harmonics generated by the laser apparatus according to the present embodiment.
FIG. 8 is a diagram of an equivalent circuit of a pixel using an organic EL device.

As shown in FIG. 7, for example, with the third harmonic generating unit 17 having the configuration described above, power of the second harmonics having the wavelength of 457 nm generated by the first nonlinear optical crystal 172 is about 2 W, and efficiency of conversion from the second harmonics having the wavelength of 457 nm to the third harmonics having the wavelength of 305 nm is about 60%.

An average power of one third harmonic is 1.2 W; repetition frequency is 1 MHz; pulse width is 0.5 ns; beam size is $5 \times 10^{-4}$ cm$^2$; and peak power density is $4.8 \times 10^6$ W/cm$^2$.

The configuration of the illuminating optical system 18 will next be described.

As shown in FIG. 6, the illuminating optical system 18 has relay lenses 181 and 182 and cylindrical lenses 183 and 184.

The relay lens 181 condenses the N third harmonics TRD1 to TRDN generated by the fourth microlens array 177 of the third harmonic generating unit 17 such that images of the third harmonics TRD1 to TRDN are superimposed on each other.

The relay lens 182 converts the images of the third harmonics condensed by the relay lens 181 into a collimated light beam, and emits the collimated light beam to the cylindrical lens 183.

The cylindrical lens 183 emits the collimated light beam, obtained by the relay lens 182, of the images of the third harmonics spatially (temporally) superimposed on each other to the cylindrical lens 184 at a wide angle so that an area to be irradiated with the collimated light beam is widened.

The cylindrical lens 184 then irradiates a predetermined irradiation area with the N third harmonics spatially (temporally) superimposed on each other and widened by the cylindrical lens 183 in a form of a line.

Operation of the above-described configuration will next be described.

The master laser 11 emits reference laser pulse light RPref having a wavelength of 914 nm and a pulse width of 0.5 ns to the beam expander 12.

The beam expander 12 converts the reference laser pulse light RPref in the form of a thin collimated light beam emitted from the master laser 11 into a thick collimated light beam, and then emits the thick collimated light beam to the microlens array 13.

In the microlens array 13, the N microlenses 13-1 to 13-N disposed in an entrance area of the reference laser pulse light RPref converted into the thick collimated light beam by the beam expander 12 divide the reference laser pulse light RPref into N pieces of light (images).

The divided pieces of reference laser pulse light DRPref1 to DRPrefN are focused on one end surface of the corresponding optical fiber amplifiers 14-1 to 14-N, respectively, to be thereby propagated through the optical fiber amplifiers 14-1 to 14-N, respectively.

Excitation light having a wavelength of 808 nm from the excitation laser light sources 15-1 to 15-N is propagated to the optical fiber amplifiers 14-1 to 14-N via the optical fibers 16-1 to 16-N and the optical fiber couplers 141-1 to 141-N, respectively. The optical fiber amplifiers 14-1 to 14-N are thereby brought into an excited state.

Accordingly, the divided pieces of reference laser pulse light DRPref1 to DRPrefN being propagated through the optical fiber amplifiers 14-1 to 14-N are each amplified with an induction gain corresponding to intensity of the excitation light to compensate for a reduction in optical power caused by dividing the reference laser pulse light RPref, and then the divided pieces of reference laser pulse light DRPref1 to DRPrefN are emitted from the other end surfaces of the optical fiber amplifiers 14-1 to 14-N to the third harmonic generating unit 17.

The N optical fiber amplifiers 14-1 to 14-N with such an amplifying function are provided with propagation delay characteristics different from each other for the divided pieces of reference laser pulse light DRPref1 to DRPrefN, that is, the propagating light.

Specifically, the optical fiber amplifiers 14-1 to 14-N are set to increase their length by 10 cm progressively in that order from the length L1 of the optical fiber amplifier 14-1 so as to have a propagation delay time of 0.5 ns, which is the pulse width of the divided pieces of reference laser pulse light DRPref1 to DRPrefN. Thus, the divided pieces of reference laser pulse light DRPref1 to DRPrefN emitted from the optical fiber amplifiers 14-1 to 14-N are emitted to the third harmonic generating unit 17 with a timing relation representing a shift of 0.5 ns.

The divided pieces of reference laser pulse light DRPref1 to DRPrefN having the wavelength of 914 nm emitted from the other end surfaces of the N optical fiber amplifiers 14-1 to 14-N enter the first microlens array 171 in the third harmonic generating unit 17.

In the first microlens array 171, the N microlenses 171-1 to 171-N disposed so as to correspond to the end surfaces of the optical fiber amplifiers 14-1 to 14-N for emitting the divided pieces of reference laser pulse light DRPref1 to DRPrefN condense the divided pieces of reference laser pulse light DRPref1 to DRPrefN, and emit the resulting pieces of reference laser pulse light DRPref1 to DRPrefN to their respective predetermined positions of the first nonlinear optical crystal 172.

The first nonlinear optical crystal 172 converts the wavelength, which is 914 nm, of each of the divided pieces of reference laser pulse light DRPref1 to DRPrefN incident thereon on the basis of nonlinear polarization to thereby generate second harmonics having a wavelength of 457 nm.

The second harmonics SND1 to SNDN and the divided pieces of reference laser pulse light DRPref1 to DRPrefN generated by the first nonlinear optical crystal 172 are emitted to the second microlens array 173.

The N microlenses 173-1 to 173-N disposed in the second microlens array 173 so as to correspond to the end surface portions of the first nonlinear optical crystal 172 for emitting the divided pieces of reference laser pulse light DRPref1 to DRPrefN and the second harmonics SND1 to SNDN convert the divided pieces of reference laser pulse light DRPref1 to DRPrefN and the second harmonics SND1 to SNDN into collimated light beams, and then emit the collimated light beams to the half-wave plate 174.

Of the divided pieces of reference laser pulse light DRPref1 to DRPrefN and the second harmonics SND1 to SNDN entering the half-wave plate 174 via the second microlens array 173, the half-wave plate 174 preserves planes of polarization of the divided pieces of reference laser pulse light DRPref1 to DRPrefN as they are, and then emits the divided pieces of reference laser pulse light DRPref1 to DRPrefN to the third microlens array 175.

On the other hand, the half-wave plate 174 rotates planes of polarization of the second harmonics SND1 to SNDN by 90°, and then emits the second harmonics SND1 to SNDN to the third microlens array 175.

The N microlenses 175-1 to 175-N disposed in the third microlens array 175 so as to correspond to the end surface portions of the half-wave plate 174 for emitting the divided pieces of reference laser pulse light DRPref1 to DRPrefN and the second harmonics SND1 to SNDN whose planes of polarization are rotated by 90° condense the divided pieces of reference laser pulse light DRPref1 to DRPrefN and the second harmonics SND1 to SNDN, and enter the divided pieces of reference laser pulse light DRPref1 to DRPrefN and the second harmonics SND1 to SNDN into their respective predetermined positions of the second nonlinear optical crystal 176.

The second nonlinear optical crystal 176 performs sum frequency mixing of the divided pieces of reference laser pulse light DRPref1 to DRPrefN having the wavelength of 914 nm and the second harmonics SND1 to SNDN having the wavelength of 457 nm entered therein, thereby generating third harmonics TRD1 to TRDN having a wavelength of 305 nm.

The generated third harmonics TRD1 to TRDN are then emitted from the second nonlinear optical crystal 176 to the fourth microlens array 177.

The N microlenses 177-1 to 177-N disposed in the fourth microlens array 177 so as to correspond to the end surface portions of the second nonlinear optical crystal 176 for emitting the third harmonics TRD1 to TRDN convert the third harmonics TRD1 to TRDN into collimated light beams, and then emit the collimated light beams to the illuminating optical system 18 in the next stage.

The relay lens 181 in the illuminating optical system 18 condenses the N third harmonics TRD1 to TRDN generated by the third harmonic generating unit 17 such that images of the third harmonics TRD1 to TRDN are superimposed on each other. Further, the relay lens 182 converts the images of the third harmonics condensed by the relay lens 181 into a collimated light beam.

The cylindrical lens 183 next emits the collimated light beam, obtained by the relay lens 182, of the images of the third harmonics spatially (temporally) superimposed on each other to the cylindrical lens 184 at a wide angle so that an area to be irradiated with the collimated light beam is widened.

The cylindrical lens 184 then irradiates a predetermined irradiation area with the N third harmonics spatially (temporally) superimposed on each other and widened by the cylindrical lens 183 in a form of a line.

As described above, the laser apparatus according to the present embodiment includes: the master laser 11 for emitting reference laser pulse light RPref having a wavelength of 914 nm and a pulse width of 0.5 ns; the microlens array 13 for dividing the reference laser pulse light RPref converted into a thick collimated light beam by the beam expander 12 into N pieces of light; the optical fiber amplifiers 14-1 to 14-N for amplifying the divided pieces of reference laser pulse light DRPref1 to DRPrefN propagated therethrough, the optical fiber amplifiers 14-1 to 14-N being set to increase their length progressively in that order so as to have a propagation delay time of 0.5 ns, which is the pulse width of the divided pieces of reference laser pulse light DRPref1 to DRPrefN; the third harmonic generating unit 17 for receiving the divided pieces of reference laser pulse light DRPref1 to DRPrefN having the wavelength of 914 nm emitted from the other end surfaces of the optical fiber amplifiers 14-1 to 14-N, and generating third harmonics TRD1 to TRDN having a wavelength of 305 nm and a pulse width of 0.5 ns; and the illuminating optical system 18 for emitting pulse light obtained by successively disposing N pieces of laser pulse light of the third harmonics TRD1 to TRDN obtained by wavelength conversion by the third harmonic generating unit 17 in parallel with each other and then subjecting the N pieces of laser pulse light to so-called time multiplexing, the obtained pulse light having a pulse width N or more times the pulse width of 0.5 ns of the reference laser pulse light RPref. Therefore, the laser apparatus has advantages of being able to be miniaturized, being able to stabilize output pulses, and accordingly making it possible to miniaturize and stabilize laser annealing apparatus and the like.

Thus, the laser apparatus 10 is suitable for use in a laser annealing apparatus, and is able to be miniaturized and stabilized. The reasons for this will be described in the following.

A laser annealing apparatus is used in a stage for manufacturing TFTs used in an active matrix display such as an LCD employing liquid crystal as electro-optical material or a display employing an organic EL device as electro-optical material, for example.

More specifically, when polysilicon having a carrier mobility higher than that of amorphous silicon (a-Si) film by about two orders of magnitude is to be formed on a glass substrate, a laser annealing apparatus is used in a manufacturing stage where the a-Si film is annealed by laser light to be recrystallized into polysilicon film to avoid thermal deformation and the like of the glass substrate.

A pixel using an organic EL device, for example, as a light-emitting device will be briefly described in the following with reference to FIG. 8 and FIG. 9.

FIG. 8 is a diagram of an equivalent circuit of a pixel using an organic EL device.

As shown in FIG. 8, the pixel 30 has a light-emitting device 31 formed by the organic EL device, a first TFT 32, a second TFT 33, and a retaining capacitor 34.

Since the organic EL device has a rectifying property in many cases, the organic EL device may be referred to as an organic light-emitting diode (OLED). In FIG. 8, a symbol of a diode is used for the light-emitting device 31.

In the example of FIG. 8, a source of the second TFT 33 is connected to a reference potential (ground potential GND). An anode of the light-emitting device 31 is connected to a power supply potential Vdd, and a cathode of the light-emitting device 31 is connected to a drain of the second TFT 33. The first TFT 32 has a gate connected to a scanning line SCAN, a source connected to a data line DATA, and a drain connected to the retaining capacitor 34 and a gate of the second TFT 33.

When the scanning line SCAN is brought into a selected state and a data potential Vw indicating brightness information is applied to the data line DATA to operate the pixel, the first TFT 32 conducts, the retaining capacitor 34 is charged or discharged, and thus a gate potential of the second TFT 33 coincides with the data potential Vw.

When the scanning line SCAN is brought into a non-selected state, the first TFT 32 is turned off, and thus the second TFT 33 is electrically disconnected from the data line DATA, while the gate potential of the second TFT 33 is stable retained by the retaining capacitor 34.

A current flowing to the light-emitting device 31 via the second TFT 33 assumes a value corresponding to a gate-to-source voltage Vgs of the second TFT 33, and the light-emitting device 31 continues emitting light at a brightness corresponding to the amount of current supplied via the second TFT 33.

Figure 9:
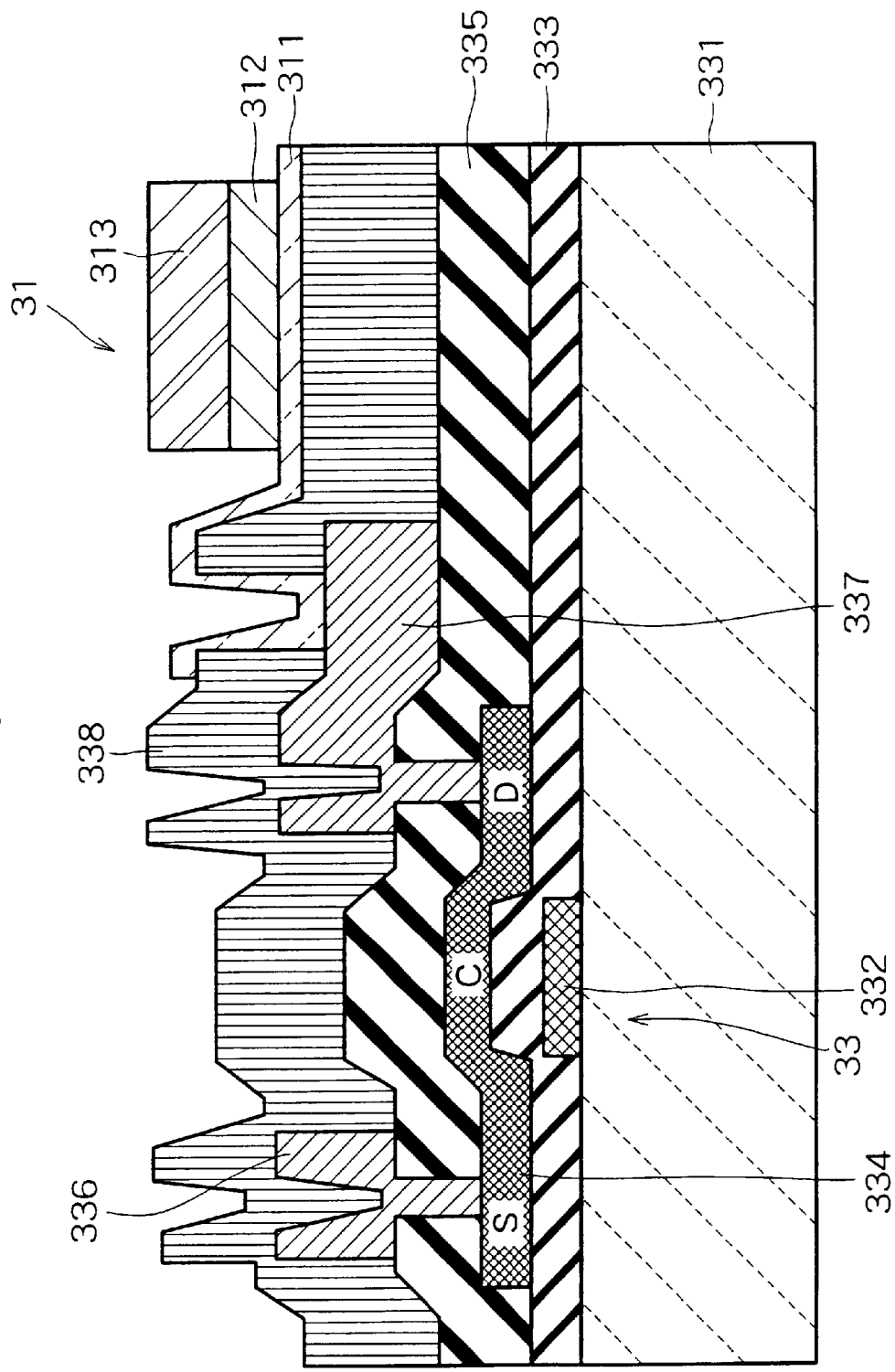
FIG. 9 is a sectional view of main parts of the pixel using the organic EL device.

FIG. 9 is a diagram schematically showing sectional structure of the pixel shown in FIG. 8. For simplicity, however, FIG. 9 shows only the light-emitting device 31 and the second TFT 33.

As shown in FIG. 9, the light-emitting device 31 is formed by stacking a transparent electrode 311, an organic EL layer 312, and a metallic electrode 313 in that order.

The second TFT 33 is formed by a gate electrode 332 formed on a glass substrate 331, a gate insulating film 333 formed by $SiO_2$ or the like laid on an upper surface of the gate electrode 332, and a semiconductor thin film 334 laid over the gate electrode 332 with the gate insulating film 333 intermediate between the semiconductor thin film 334 and the gate electrode 332. The second TFT 33 has a source S, a channel Ch, and a drain D that form a passageway for current to be supplied to the light-emitting device 31. The channel Ch is located directly above the gate electrode 332.

The second TFT 33 having this bottom-gate structure is covered by an interlayer insulating film 335. A source electrode 336 and a drain electrode 337 are formed on the interlayer insulating film 335. The light-emitting device 31 is formed above these components with another interlayer insulating film 338 intermediate between the light-emitting device 31 and the components.

A process for fabricating the second TFT 33 is substantially as follows.

The gate electrode 332, the gate insulating film 333, and the semiconductor thin film 334 of a-Si are sequentially deposited and patterned on the glass substrate 331 to thereby form the second TFT 33.

In this case, a laser annealing apparatus including the laser apparatus according to the present invention is used to anneal the a-Si film by laser light to recrystallize the a-Si film into polysilicon film.

Thus, it is possible to fabricate the TFT 33 having a higher carrier mobility and a higher current driving capability as compared with a-Si.

Reasons that the laser apparatus 10 according to the present invention can be used in a laser annealing apparatus in place of a XeCl excimer laser will be described in the following.

As described above, the pulse repetition frequency of the near-infrared master laser 11 having the wavelength of 914 nm is 1 MHz or more, and is sufficiently higher than the pulse repetition frequency of a XeCl excimer laser of 300 Hz. However, the pulse width of the master laser 11 is generally smaller than the pulse width of the XeCl excimer laser.

Figure 10:
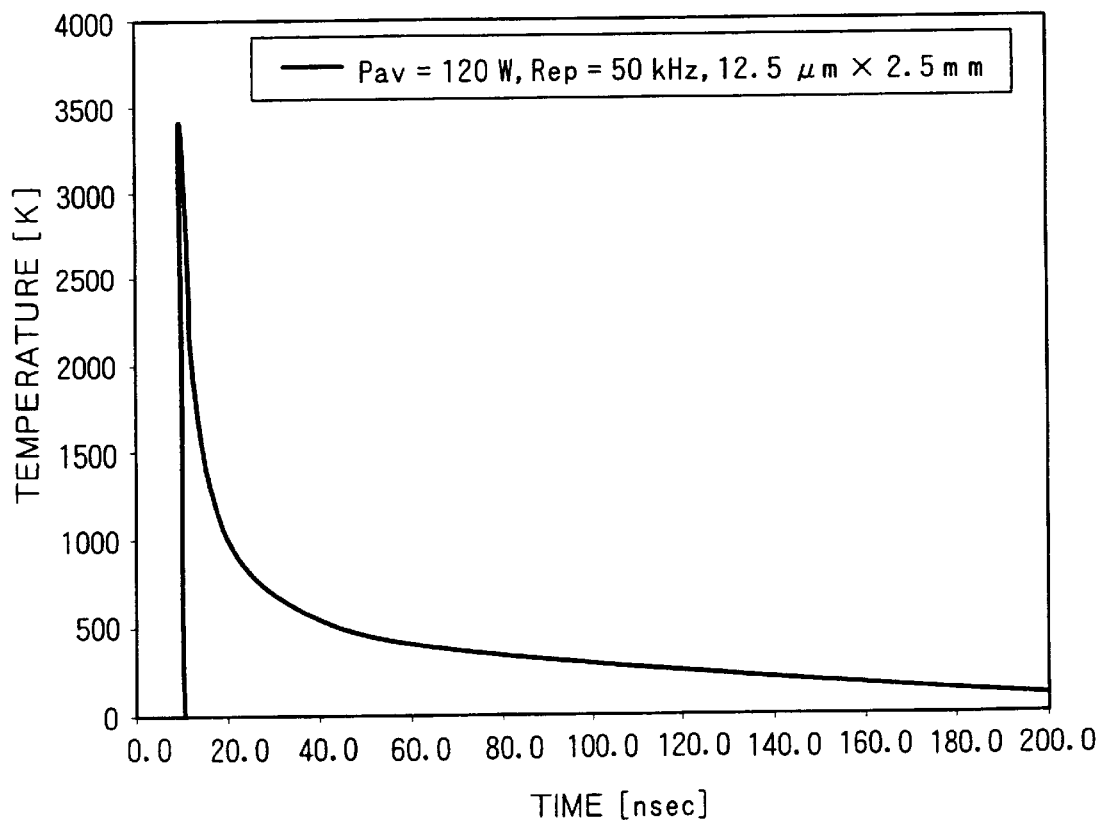
FIG. 10 is a temperature profile when a-Si is irradiated with pulse light having a pulse width of 0.5 ns at 100 mJ/cm$^2$.

Accordingly, the pulse width of the ultraviolet light having the wavelength of 305 nm obtained by the wavelength conversion described above is also smaller than the pulse width of the XeCl excimer laser. It is therefore relatively easy to achieve high optical density. However, when a-Si is irradiated with the ultraviolet light having the wavelength of 305 nm obtained by the wavelength conversion, it instantaneously reaches an absolute temperature of 3400° K, as shown in FIG. 10.

This temperature is in an upper limit range of temperatures 1000 to 3500° C. suitable for melting a-Si, and therefore may evaporate the a-Si.

The laser apparatus 10 according to the present invention, however, equivalently increases the pulse width of the near-infrared master laser by using the plurality of optical fiber amplifiers 14-1 to 14-N for amplifying the divided pieces of reference laser pulse light DRPref1 to DRPrefN propagated therethrough, the optical fiber amplifiers 14-1 to 14-N being set to increase their length progressively in that order so as to have a propagation delay time of 0.5 ns, which is the pulse width of the divided pieces of reference laser pulse light DRPref1 to DRPrefN. The laser apparatus 10 thereby increases the pulse width of the third harmonics having the wavelength of 305 nm generated by using the two nonlinear optical crystals, and obtains optical energy sufficient to melt the silicon surface.

Figure 11:
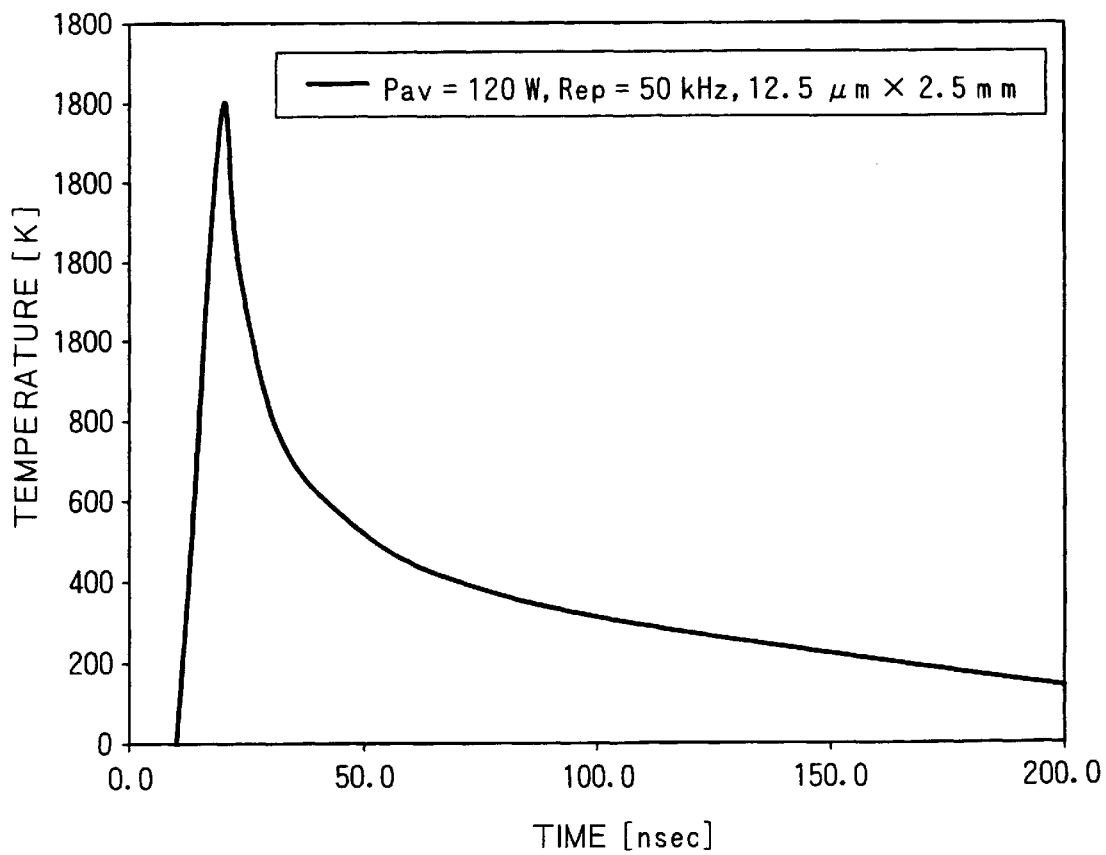
FIG. 11 is a temperature profile when a-Si is irradiated with pulse light having a pulse width of 10 ns at 100 mJ/cm$^2$.

Specifically, when a-Si is irradiated with the ultraviolet light having the wavelength of 305 nm obtained from the illuminating optical system 18 by the wavelength conversion, it reaches an absolute temperature of about 1600° K, as shown in FIG. 11. Thus, the laser apparatus 10 according to the present invention can generate laser light most suitable for recrystallization of a-Si.

In other words, the fluence required to anneal a TFT using a XeCl excimer laser having a wavelength of 308 nanometers is a few hundred mJ/cm$^2$, and the pulse width is about 20 ns.

When a near-infrared laser commercialized as a microchip laser is used for the master laser, on the other hand, the required fluence can be readily obtained by amplification using the fiber amplifiers and generation of third harmonics. Since the pulse width of the microchip laser is 0.5 ns, however, peak optical density of the microchip laser is 20 times that of the XeCl excimer laser under the same fluence. Hence, the silicon surface is melted momentarily, but the temperature cannot be retained, so that time response of temperature sufficient to anneal the silicon cannot be realized.

Thus, the laser apparatus 10 according to the present invention obtains optical energy sufficient to melt the silicon surface by performing the operation for increasing the pulse width while maintaining the total fluence.

FIG. 10 is a temperature profile when a-Si is irradiated with pulse light having a pulse width of 0.5 ns at 100 mJ/cm$^2$.

FIG. 11 is a temperature profile when a-Si is irradiated with pulse light having a pulse width of 10 ns at 100 mJ/cm$^2$.

Figure 12:
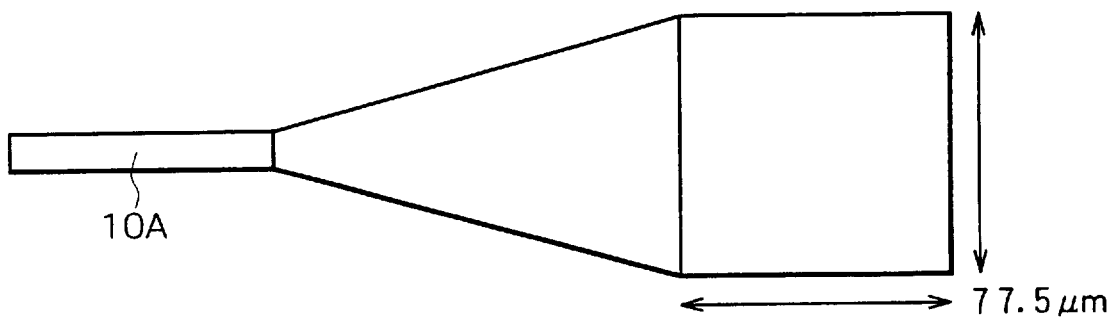
FIG. 12 is a diagram of assistance in explaining an example of use of the laser apparatus in FIG. 1.

Assuming a laser apparatus 10A using 20 of optical fiber amplifiers 14-1 to 14-N having different propagation delay characteristics, for example, a pulse can be stretched at 10/0.5=20 (degree of time multiplexing of 20), and irradiation laser light of 75 μm×75 μm as shown in FIG. 12 can be obtained.

In this case, letting an irradiated area be S, fluence F is given by the following equations:

$$F = 0.4 \ J/cm^2 = 1.2W/1 \ MHz/S \ cm^2 \quad \text{[Equation 3]}$$

$$S = 3 \times 10^{-6} \ cm^2 = 3 \times 10^2 \ \mu m^2 \quad \text{[Equation 4]}$$

Figure 13:
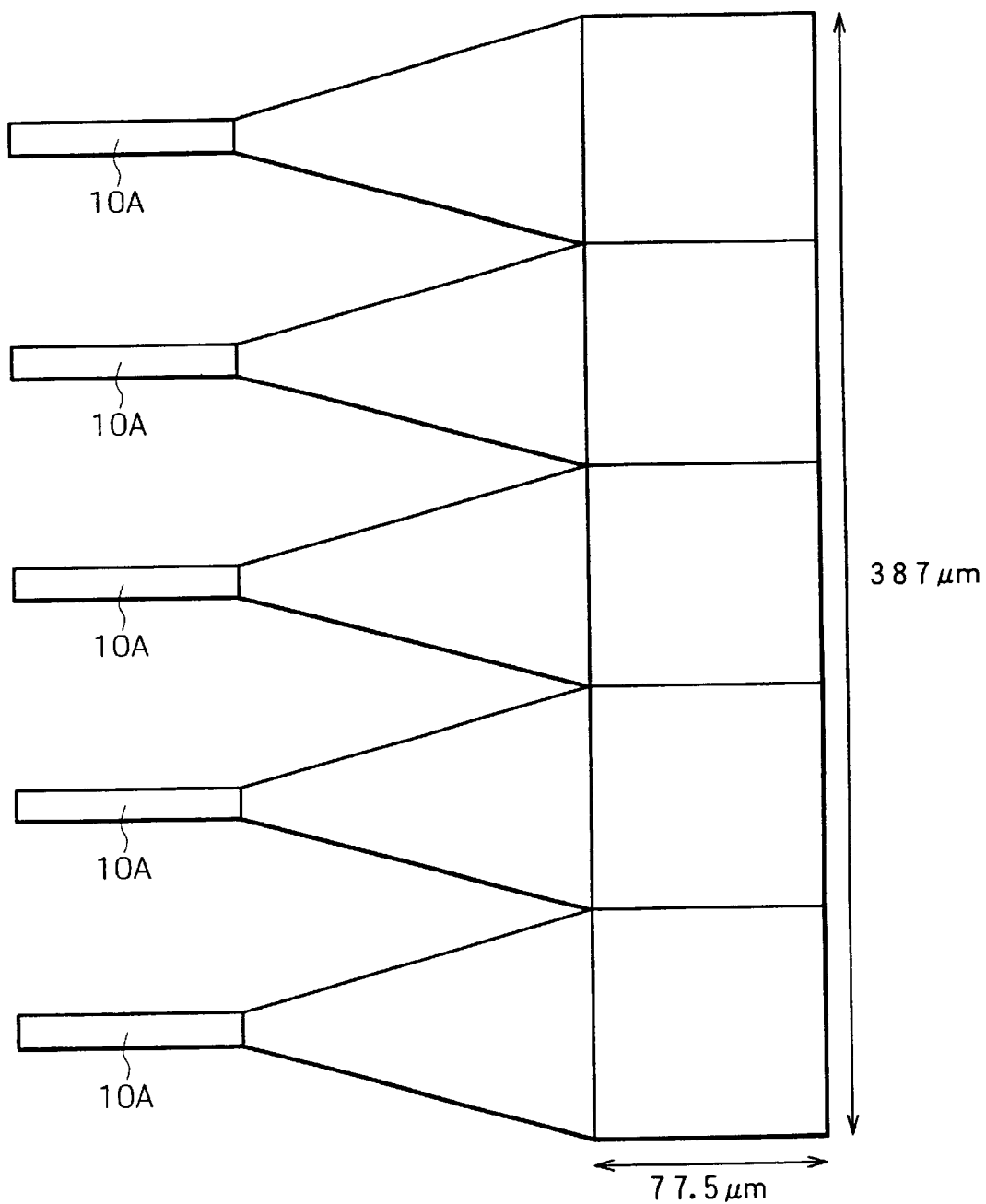
FIG. 13 is a diagram of assistance in explaining another example of use of the laser apparatus in FIG. 1.

In addition, as shown in FIG. 13, irradiation laser light of 77.5 μm×387 μm can be obtained by employing five laser apparatus 10A in parallel with each other (degree of spatial multiplexing of 5), which apparatus each use 20 of optical fiber amplifiers 14-1 to 14-N having different propagation delay characteristics, for example.

In this case, 100S=300×10$^{-6}$ cm$^2$, and repetition frequency is 1 MHz.

Incidentally, in the case of the XeCl excimer laser, S=0.8 cm$^2$, and repetition frequency is 300 Hz.

It is to be noted that while the above description assumes that the induction gains of the optical fiber amplifiers 14-1 to 14-N are substantially equal to each other, a desired pulse waveform can be realized when an optical amplification factor (gain) that differs according to propagation delay time is provided by configuring the laser apparatus such that the induction gain can be set for each of the optical fiber amplifiers 14-1 to 14-N, or specifically, configuring the laser apparatus such that the output power of each of the excitation laser light sources 15-1 to 15-N can be adjusted individually.

Figure 14:
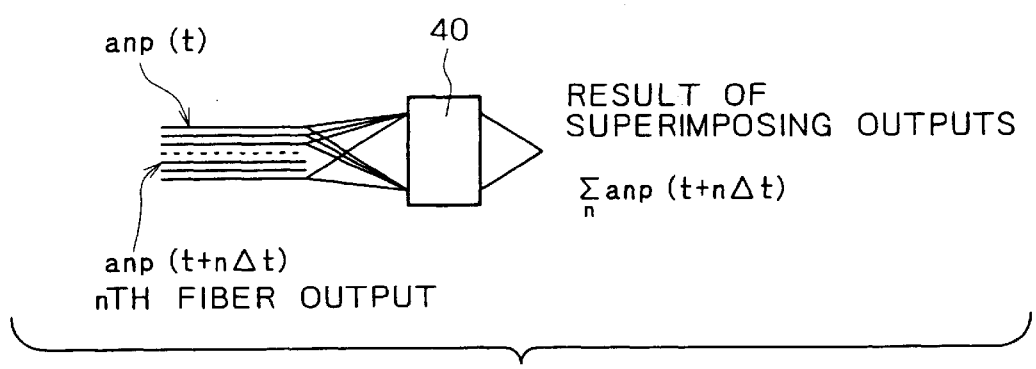
FIG. 14 is a diagram of assistance in explaining a configuration for generating an arbitrary annealing pulse waveform as an envelope curve obtained by adjusting amplitude and delay time of each pulse train.
Figure 15:
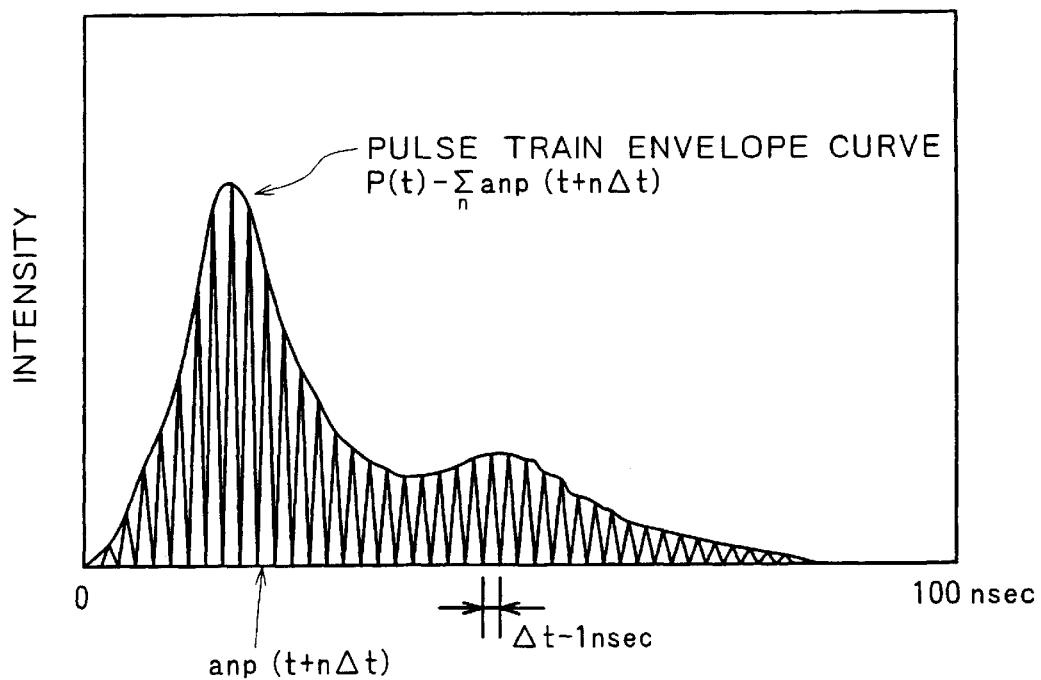
FIG. 15 is a diagram showing an example of a pulse-train envelope curve obtained by adjusting amplitude and delay time of each pulse train.

Specifically, an arbitrary annealing pulse waveform as shown in FIG. 15 can be generated as an envelope obtained by adjusting amplitude and delay time of each pulse train and superimposing resulting outputs on each other by using a lens 40 as shown in FIG. 14 or the like.

While the preferred embodiments have been described using specific terms, such description is for illustrative purposes only, and it is to be understood that changes and variations may be made without departing from the spirit or scope of the following claims.

What is claimed is:

1. A laser apparatus comprising:
   a laser light source for emitting reference laser pulse light having a predetermined wavelength and a predetermined pulse width;
   a plurality of optical fibers having different propagation delay characteristics for propagating light;
   light dividing means for dividing the reference laser pulse light emitted from said laser light source into a plurality of pieces of light to propagate each of the divided pieces of reference laser pulse light through one of said plurality of optical fibers; and
   light combining means for successively disposing the divided pieces of reference laser pulse light propagated through said plurality of optical fibers and emitted from said plurality of optical fibers in parallel with each other and emitting laser pulse light having a pulse width greater than the pulse width of the reference laser pulse light.

2. A laser apparatus as claimed in claim 1, wherein said light combining means includes:
   wavelength changing means for changing wavelength of the divided pieces of reference laser pulse light emitted from said plurality of optical fibers to a wavelength shorter than the predetermined wavelength; and
   an optical system for successively disposing the plurality of pieces of laser pulse light changed in wavelength by said wavelength changing means in parallel with each other and emitting laser pulse light having a pulse width greater than the pulse width of the reference laser pulse light.

3. A laser apparatus as claimed in claim 2, wherein said wavelength changing means includes at least one nonlinear optical crystal for generating an n-order harmonic (n is an integer of two or more) on the basis of incident light.

4. A laser apparatus as claimed in claim 2, wherein said wavelength changing means includes:
   a first nonlinear optical crystal for receiving the divided pieces of reference laser pulse light emitted from said plurality of optical fibers, generating a plurality of second harmonics, and emitting the plurality of divided pieces of reference laser pulse light and the plurality of second harmonics; and a second nonlinear optical crystal for generating third harmonics on the basis of the plurality of divided pieces of reference laser pulse light and the plurality of second harmonics emitted from said first nonlinear optical crystal; and said optical system successively disposes the plurality of third harmonics emitted from said second nonlinear optical crystal in parallel with each other and emits laser pulse light having a pulse width greater than the pulse width of the reference laser pulse light.

5. A laser apparatus as claimed in claim 2, wherein said plurality of optical fibers are each set at a different propagation length so that the pieces of laser pulse light are sequentially emitted with a propagation delay time corresponding to the pulse width of the reference laser pulse light.

6. A laser apparatus as claimed in claim 1, wherein said plurality of optical fibers are each set at a different propagation length so that the pieces of laser pulse light are sequentially emitted with a propagation delay time corresponding to the pulse width of the reference laser pulse light.

7. A laser apparatus comprising:

a laser light source for emitting reference laser pulse light having a predetermined wavelength and a predetermined pulse width;

a plurality of optical fiber amplifiers having different propagation delay characteristics for propagating light for amplifying the propagating light with a gain corresponding to intensity of excitation light supplied thereto;

excitation light supplying means for supplying the excitation light to said plurality of optical fiber amplifiers;

light dividing means for dividing the reference laser pulse light emitted from said laser light source into a plurality of pieces of light to propagate each of the divided pieces of reference laser pulse light through one of said plurality of optical fiber amplifiers; and light combining means for successively disposing the divided pieces of reference laser pulse light propagated through said plurality of optical fiber amplifiers and emitted from said plurality of optical fiber amplifiers in parallel with each other and emitting laser pulse light having a pulse width greater than the pulse width of the reference laser pulse light.

8. A laser apparatus as claimed in claim 7, wherein said light combining means includes:

wavelength changing means for changing wavelength of the divided pieces of reference laser pulse light emitted from said plurality of optical fiber amplifiers to a wavelength shorter than the predetermined wavelength; and an optical system for successively disposing the plurality of pieces of laser pulse light changed in wavelength by said wavelength changing means in parallel with each other and emitting laser pulse light having a pulse width greater than the pulse width of the reference laser pulse light.

9. A laser apparatus as claimed in claim 8, wherein said wavelength changing means includes at least one nonlinear optical crystal for generating an n-order harmonic (n is an integer of two or more) on the basis of incident light.

10. A laser apparatus as claimed in claim 8, wherein said wavelength changing means includes:

a first nonlinear optical crystal for receiving the divided pieces of reference laser pulse light emitted from said plurality of optical fiber amplifiers, generating a plurality of second harmonics, and emitting the plurality of divided pieces of reference laser pulse light and the plurality of second harmonics; and a second nonlinear optical crystal for generating third harmonics on the basis of the plurality of divided pieces of reference laser pulse light and the plurality of second harmonics emitted from said first nonlinear optical crystal; and said optical system successively disposes the plurality of third harmonics emitted from said second nonlinear optical crystal in parallel with each other and emits laser pulse light having a pulse width greater than the pulse width of the reference laser pulse light.

11. A laser apparatus as claimed in claim 8, wherein said plurality of optical fiber amplifiers are each set at a different propagation length so that the pieces of laser pulse light are sequentially emitted with a propagation delay time corresponding to the pulse width of the reference laser pulse light.

12. A laser apparatus as claimed in claim 8, wherein intensity of the excitation light supplied to said plurality of optical fiber amplifiers is set at a desired value for each of said plurality of optical fiber amplifiers.

13. A laser apparatus as claimed in claim 7, wherein said plurality of optical fiber amplifiers are each set at a different propagation length so that the pieces of laser pulse light are sequentially emitted with a propagation delay time corresponding to the pulse width of the reference laser pulse light.

14. A laser apparatus as claimed in claim 7, wherein intensity of the excitation light supplied to said plurality of optical fiber amplifiers is set at a desired value for each of said plurality of optical fiber amplifiers.

* * * * *